United States Patent [19]
Nolan et al.

[11] Patent Number: 5,780,101
[45] Date of Patent: Jul. 14, 1998

[54] METHOD FOR PRODUCING ENCAPSULATED NANOPARTICLES AND CARBON NANOTUBES USING CATALYTIC DISPROPORTIONATION OF CARBON MONOXIDE

[75] Inventors: Peter E. Nolan; Andrew H. Cutler; David G. Lynch, all of Tucson, Ariz.

[73] Assignee: Arizona Board of Regents on behalf of the University of Arizona, Tucson, Ariz.

[21] Appl. No.: 389,900

[22] Filed: Feb. 17, 1995

[51] Int. Cl.$^6$ .............................. C23C 16/26; D01F 9/12; C01B 31/02
[52] U.S. Cl. .................. 427/216; 427/249; 423/447.3; 423/445 B; 423/445 R; 423/DIG. 40
[58] Field of Search ............................ 423/447.2, 447.3, 423/445 B, DIG. 40, 445 R; 427/216, 249

[56] References Cited

U.S. PATENT DOCUMENTS 5,165,909  11/1992  Tennet, et al. ................... 423/447.3
5,171,560  12/1992  Tennent ........................... 423/447.2

FOREIGN PATENT DOCUMENTS 1693004  11/1991  U.S.S.R. .......................... 423/447.2
2248230  4/1992   United Kingdom ............... 423/447.3

OTHER PUBLICATIONS

Applied Catalysis, vol. 66, 1990, E. Tracz, et al., "High-Resolution Electron Microscopy Study Of The Carbon Deposit Morphology On Nickel Catalysts", pp. 133–147, no months.

Ultramicroscopy, vol. 34, pp. 54–59, 1990, David J. Smith, et al., "Characterization Of Filamentous Carbon On Ni/MgO Catalysts By High–Resolution Electron Microscopy", no month.

Comptes Rendus Academie des Sciences, vol. 111, pp. 774–777, 1890, Paul et Leon Schutzenberger, "Sur Quelques Fais Relatifs A L'Histoire Du Carbone", no month.

Journal of Catalysis, vol 27, pp. 343–356, 1972, Jens R. Rostrup–Nielsen, "Equilibria Of Decomposition Reactions Of Carbon Monoxide And Methane Over Nickel Catalysts", no month.

Metallurgical Transactions, vol. 5, pp. 21–26, Jan. 1974, R. G. Olsson, et al., "Catalytic Effect Of Iron On Decompostion Of Carbon Monoxide: II. Effect Of Additions Of H2, H2o, CO2, SO2 And H2S".

Journal of Crystal Growth, vol. 32, pp. 335–349, 1976, A. Oberlin, et al., "Filamentous Growth Of Carbon Through Benzene Decomposition", no month.

UA/SERC Annual Progress Report, pp. 73–82, 1994, Peter E. Nolan, et al., "Carbon Formation In Space Oxygen Processes: The Importance Of Hydrogen", no month.

Engineering, Construction, and Operations in Space IV, vol. 2, pp. 1199–1209, 1994, Peter E. Nolan, et al., "Carbon Formation Theory For Space Oxygen Processes", no month.

Master of Science Thesis, Department of Materials Science and Engineering, The University of Arizona, pp. 1–161, 1992, Peter Eugene Nolan, "Separating Carbon Monoxide From Carbon Dioxide For Mars Oxygen Production Using Catalytic Disproportionation Or Selective Solid Adsorption", no month.

(List continued on next page.)

*Primary Examiner*—Michael Lewis
*Assistant Examiner*—Peter DiMauro
*Attorney, Agent, or Firm*—Oblon, Spivak, McClelland, Maier & Neustadt, P.C.

[57] ABSTRACT

A method for the production of carbon encapsulated nanoparticles, carbon nanotubes and other closed carbon structures, including contacting a catalyst of a transition metal, or a compound or alloy thereof, with a gas mixture containing carbon monoxide, and an amount of available molecular hydrogen which is insufficient to cause formation of graphite plane edges through capping, at a temperature in the range from 300°–1000° C., to provide closed carbon structures, which are useful in the preparation of thermal composites, reinforcement composites and magnetic particle recording media.

16 Claims, 5 Drawing Sheets

OTHER PUBLICATIONS

Carbon, vol. 33, No. 1, pp. 79–85, 1995, Peter E. Nolan, et al., "Hydrogen Control Of Carbon Deposit Morphology", no month.

J. Phys. Chem., vol. 59, pp. 1153–1155, Nov. 1955, L. J. E. Hofer, et al., "Structure Of The Carbon Deposited From Carbon Monoxide On Iron, Cobalt And Nickel".

Carbon, vol. 19, pp. 99–105, 1981, M. Audier, et al., "Formation And Characterization Of Catalytic Carbons Obtained From CO Disproportionation Over An Iron Nickel Catalyst–II–Characterization", no month.

Carbon, vol. 19, pp. 95–98, 1981, J. Guinot, et al., "Formation And Characterization Of Catalytic Carbons Obtained From CO Disproportionation Over Iron Nickel Catalyst–I–Fragmentation And Rates Of Carbon Deposition", no month.

Carbon, vol. 30, No. 3, pp. 415–418, 1992, F. W. A. H. Geurts, et al., "The Relative Rates Of The Boudouard Reaction And Hydrogenation Of CO Over Fe And CO Foils", no month.

Journal of Catalysts, vol. 96, pp. 481–490, 1985, E. Boellaard, et al., "The Formation Of Filamentous Carbon On Iron And Nickel Catalysts", no month.

Journal of Catalysts, vol. 96, pp. 468–480, 1985, A. J. H. M. Kock, et al., "The Formation Of Filamentous Carbon On Iron And Nickel Catalysts", no month.

Journal of Catalysis, vol. 96, pp. 454–467, 1985, P. K. De Bokx, et al., "The Formation Of Filamentous Carbon On Iron And Nickel Catalysts", no month.

Journal of Catalysis, vol. 37, pp. 101–105, 1975, R. T. K. Baker, et al., "Formation Of Carbonaceous Deposits From The Platinum–Iron Catalyzed Decompositon Of Acetylene", no month.

Mat. Res. Soc. Symp. Proc., vol. 349, pp. 251–256, 1994, R. Terry K. Baker, et al., "Catalytic Growth Of Carbon Nanofibers And Nanotubes", no month.

Journal of Catalysis, vol. 30, pp. 86–95, 1973, R. T. K. Baker, et al., "Formation Of Filamentous Carbon From Iron, Cobalt And Chromium Catalyzed Decomposition Of Acetylene", no month.

Carbon, vol. 21, No. 5, pp. 463–468, 1983, R. T. K. Baker, et al., "The Formation Of Filamentous Carbon From Decomposition Of Acetylene Over Vanadium And Molydenum", no month.

Journal of Catalysis, vol. 26, pp. 51–62, 1972, R. T. K. Baker, et al., "Nucleation And Growth Of Carbon Deposits From The Nickel Catalyzed Decomposition Of Acetylene", no month.

Nature, vol. 233, pp. 329–330, Oct. 1, 1971, T. Baird, et al., "Structure Of Fibrous Carbon".

Journal of Applied Physics, vol. 31, No. 2, pp. 283–290, Feb. 1960, Roger Bacon, "Growth, Structure, And Properties Of Graphite Whiskers".

Carbon, vol. 21, No. 2, pp. 93–97, 1983, M. Audier, et al., "Disproportion Of CO On Iron Cobalt Alloys–I–Thermodynamic Study", no month.

Carbon, vol. 21, No. 2, pp. 99–103, 1983, M. Audier, et al., "Disproportion Of CO On Iron Cobalt Alloys–II–Kinetic Study On Iron–Cobalt Alloys Of Different Compositions", no month.

Carbon, vol. 21, No. 2, pp. 105–110, 1983, M. Audier, et al., "Disproportionation Of CO On Iron–Cobalt Alloys–III–Kinetic Laws Of The Carbon Growth And Catalyst Fragmentation", no month.

Carbon, vol. 32, No. 3, pp. 477–483, 1994, Peter E. Nolan, et al., "Catalytic Disproportionation Of CO In The Absence Of Hydrogen: Encapsulating Shell Carbon Formation", no month.

Carbon, vol. 30, No. 1, pp. 87–97, 1992, G. A. Jablomski, et al., "Carbon Deposition Over Fe, Ni, And CO Foils From $CO-H_2-CH_4-CO_2-H_2O$, $CO-CO_2$, $CH_4-H_2$, And $CO-H_2-H_2O$ Gax Mixtures: I.Morphology", no month.

J. Mater. Res., vol. 8, No. 12, pp. 3233–3250, Dec. 1993, N. M. Rodriguez, "A Review Of Catalytically Grown Carbon Nanofibers".

Carbon, vol. 27, No. 3, pp. 315–323, 1989, R. T. K. Baker, "Catalytic Growth of Carbon Filaments", no month.

Science, vol. 265, pp. 635–639, Jul. 29, 1994, S. Amelinckx, et al., "A Formation Mechanism For Catalytically Grown Helix–Shaped Graphite Nanotubes", no month.

Appl. Phys. Lett. vol. 62, No. 6, pp. 657–659, Feb. 8, 1993, M. Jose–Yacaman, et al., "Catalytic Growth Of Carbon Microtubules With Fullerine Structure".

Chemical Physics Letters, vol. 217, No. 4, pp. 398–402, Jan. 21, 1994, Naoki Hatta, et al., "Very Long Graphitic Nano–Tubules Synthesized By Plasma–Decomposition Of Benzene".

Nature, vol. 354, pp. 56–58, Nov. 7, 1991, Sumio Iijima, "Helical Microtubules of Graphitic Carbon".

Carbon, vol. 23, No. 3, pp. 317–323, 1985, M. Audier, et al., "Kinetic And Microscopic Aspects Of Catalytic Carbon Growth", no month.

Nature, vol. 357, pp. 365–366, Jun. 4, 1992, Paul Calvert, "Strength In Disunity".

Nature, vol. 358, pp. 220–222, Jul. 16, 1992, T. W. Ebbesen, et al., "Large–Scale Synthesis Of Carbon Nanotubes".

Journal of Catalysts, vol. 115, pp. 52–64, 1989, R. T. Yang, et al.,"Mechanism Of Carbon Filament Growth On Metal Catalysts", no month.

J. Phys. Chem., vol. 63, pp. 133–140, 1959, P. L. Walker, et al., "Carbon Formation From Carbon Monoxide–Hydrogen Mixtures Over Iron Catalysts. I. Properties Of Carbon Formed", no month.

UA/SERC Annual Progress Report, pp. 287–304, 1993, Peter A. Nolan, et al., "Effect Of Hydrogen On Carbon Deposition Morphology And Reaction Rates For The Catalytic Disproportionation Of Co", no month.

The Journal of Physical Chemistry, vol. 97, No. 27, pp. 6941–6942, Jul. 8, 1993, Louis S. K. Pang, et al., "Thermogravimetric Analysis Of Carbon Nanotubes And Nanoparticles".

"Masters Abstracts International", 1992, vol. 31, #1, p. 413, found on file DISSABS in STN database as accession No. 93: 10650.

METHOD FOR PRODUCING ENCAPSULATED NANOPARTICLES AND CARBON NANOTUBES USING CATALYTIC DISPROPORTIONATION OF CARBON MONOXIDE

This invention was supported by Grant No. G1134204 from the National Aeronautics and Space Administration of the U.S. Government and as such the U.S. Government has certain rights in the present invention.

BACKGROUND OF THE INVENTION

1. Field of the Invention

The present invention relates to a method for the production of carbon coated nanoparticles and carbon nanotubes by catalytic disproportionation of carbon monoxide and the nanoparticles and highly oriented carbon nanotubes produced from the method.

2. Discussion of the Background

Catalyzed deposition of carbon from the gas phase results in a number of different morphologies. The form in which carbon deposits can be of considerable practical importance (Rodriguez, *J. Mater. Res.* 8, 3233 (1993)). Carbon deposition can foul reactors or deactivate catalysts. On the other hand, materials with special properties such as high surface area, conductivity, or high strength or modulus can be produced under appropriate conditions. The factors controlling the form of carbon deposited are not well understood at a basic level.

Figure 1:
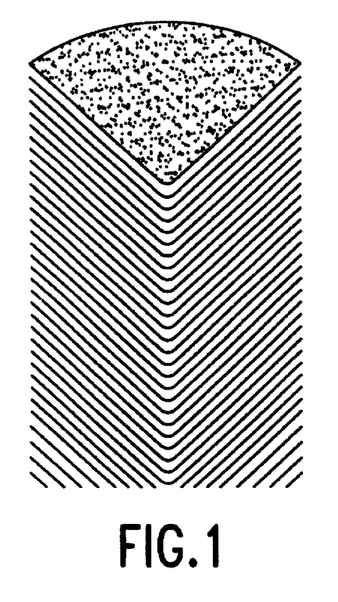
FIG. 1 is a diagram of the cross section of a theoretically "perfect" filament.
Figure 2:
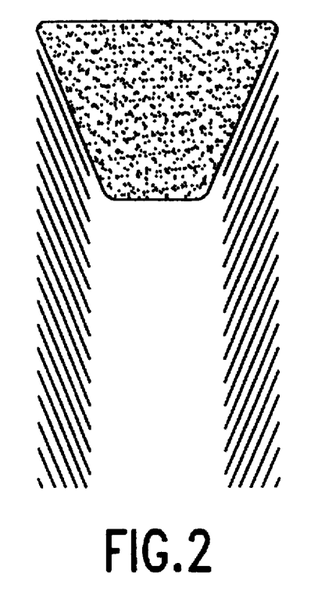
FIG. 2 is a diagram of the cross section of a common "hollow" filament.

Carbon filaments are formed when a crystallite is broken away from the bulk catalyst metal, depositing a "tail" of graphitic carbon behind it (Baker et al., In *Chemistry and Physics of Carbon* (Edited by P. L. Walker and P. A. Thrower) Vol. 14, pg. 83–165, Marcel Dekker, New York (1978), Alstrup, *J. Catal.* 109, 241 (1988), and Yang et al., *J. Catal.* 115, 52 (1989)). Filaments are illustrated in FIGS. 1 and 2. Catalyst particle shape and graphite orientation in the filament can vary considerably (Tracz, et al., *Applied Catalysis* 66, 133 (1990)). The feature common to all such filaments is that carbon cones or frustra are "stacked". The graphite basal planes are not parallel to the axis of the filament, so there must be exposed carbon lattice edges at the outer circumference of each carbon layer in a filament. These represent a large number of potentially unsatisfied valences which are believed to be capped by hydrogen atoms.

Figure 3:
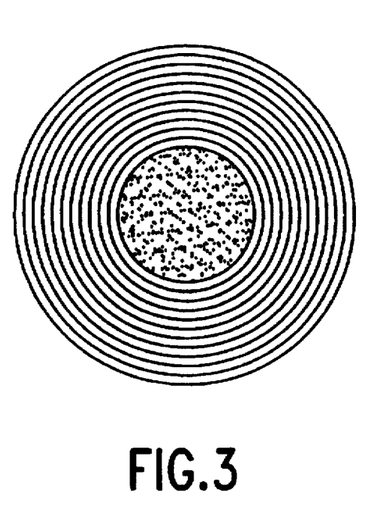
FIG. 3 is a diagram of an encapsulating shell carbon on a catalyst particle.

A less common carbon deposit consists of multi-layer "shells" encapsulating catalyst particles. This closed form of carbon is illustrated in FIG. 3. Shells were originally found at higher reaction temperatures, as shown by Audier and co-workers (Audier et al., *Carbon* 19, 99 (1981)). In their work, a transition from filament to shell carbon occurred above 500° C. when 0.2% Hz was present in the CO (Guinot et al., *Carbon* 19, 95 (1981)). Note that Audier and Guinot imply they are working in a hydrogen free system.

Jose-Yacaman et al (Jose-Yacaman et al., *Appl. Phys. Lett.* 62, 657 (1993)) describe the formation of nanotube-like filaments from benzene at a relatively high temperature, where the inherent chemical nature of benzene and its decomposition products controls the hydrogen activity, or availability, keeping it at a fixed and relatively low level. Thus their shells and nanotubes have a certain reasonably low number of hydrogen capped plane edges per unit carbon deposited. While this number is low, it is, however, not zero, and cannot be varied substantially as it is controlled by an inherent property of the starting material, benzene.

The control of available hydrogen has not been understood by researchers in this field as a critical parameter in the production of closed carbon structures. As an example, Tenant, U.S. Pat. No. 5,165,909, discloses the supposed production of nanotubes. However, a close examination of the conditions used by Tenant indicates that the structures being produced are actually filaments. In fact, Tenant indicates that a wide range of process parameters can be used to prepare 'nanotubes', even though it is apparent that the products produced by Tenant are not nanotubes as conventionally understood and that the patent makes indiscriminate use of the terms "filament", "fibril", and "tube".

In investigations with no hydrogen present in the reaction gas, shells and other non-filamentary carbons were formed at lower temperatures (Nolan et al., *Carbon* 32, 479 (1994)). In addition, as noted above, descriptions of shells and tubes formed by the high temperature catalytic decomposition of benzene appear in the literature. (Jose-Yacaman et al., *Appl. Phys. Lett.* 62, 657 (1993)). However, from the micrographs presented, it is apparent that these 'tubes' are poorly formed intermediates between tubes and filaments, and would understandably be so due to the presence of hydrogen available from the benzene precursor at some level which cannot be reduced. The mechanism of catalytic shell carbon growth has not been elucidated. However, it is noted that Jablonski et al (Jablonski et al., *Carbon* 30(1), 87 (1992)) have shown that previous reports of structures prepared in the total absence of hydrogen, were in actuality formed in a reaction gas having 0.2% or more of hydrogen as an impurity, as reported by the previous workers themselves. In fact, they indicate that the reaction of 2 mol of Co to give $C+CO_2$ has a rate of essentially zero in the absence of hydrogen.

Figure 4:
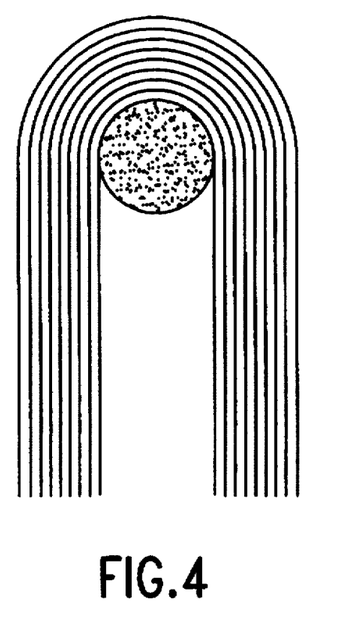
FIG. 4 is a diagram of the cross section of a carbon nanotube of the present invention having a catalyst particle at its end.

A novel form of carbon, depicted in FIG. 4, appears as long hollow tubes, with an outer diameter commonly about 15 nm. These carbon structures are distinguished from filaments by the direction of the graphite basal planes: parallel to the axis of the tube. With hemispherical caps at their ends, these are closed forms of carbon and could be considered "higher fullerenes." In recent literature by fullerene researchers (Pang et al., *J Phys. Chem.* 97, 6941 (1993), Seraphin et al., *Carbon* 31, 685 (1993), and Ebbesen et al., *Nature* 367, 519 (1994)) similar but smaller (thinner) carbon formations are observed, and are often referred to as nanotubes. Nanotubes are normally produced by arc-discharge evaporation techniques designed for fullerene production (Iijima, *Nature* 354, 56 (1991)), but have also been produced catalytically from benzene (Jose-Yacaman et al.) or CO (Nolan et al., In *Engineering, Construction, and Operations in Space IV* (Edited by R. G. Galloway and S. Lokaj) Vol. 2, pg. 1199, American Society of Civil Engineers, New York (1994)). Nanotubes have the distinction of being the most resistant of the known forms of carbon to oxidation, while filaments, with their open plane edges, are far less resistant to oxidation. (Pang et al). The arc-discharge technique has been used to produce not only nanotubes, but also shells and nanoencapsulates.

A variety of conditions can affect the carbon deposit's morphology. Reaction temperature is known to be an important factor (Audier et al). Catalyst particle size and shape (Tracz et al) and the chemical nature of the catalyst (e.g. alloy) (Kim et al., *J. Catal.* 134, 253 (1992)) also play a role. The overall chemical reaction that the carbon containing gas mixture undergoes to produce solid carbon does not generally determine morphology. For instance: both CO disproportionation with hydrogen present and steam reforming of butane (Tracz et al) can produce similar appearing filamentous deposits. The carbon activity in the gas phase determines whether a carbide can form from a particular catalyst metal. Carbide formation in the catalyst metal is believed to have an influence on fragmentation and the creation of filaments (de Bokx et al., *J Catal* 96, 454 (1985)). Duration of reaction is also important, as one form of carbon can be produced at first, with another form appearing after longer reaction times (Jablonski et al). Many other effects, such as metal-support interactions (Baker et al., *Carbon* 21(5), 463 (1983)), can also affect carbon deposit morphology.

Unfortunately, up until now there has been no definitive method for obtaining nanotubes under controlled conditions which allow for the formation of uniform nanotubes of highly oriented graphite structure.

SUMMARY OF THE INVENTION

Accordingly, one object of the present invention is to provide a method for the preparation of nanotubes by the catalytic disproportionation of carbon monoxide.

A further object of the present invention is to provide a method for the catalytic production of nanotubes in the substantial absence of hydrogen.

A further object of the present invention is to provide a method for the production of nanotubes which are highly crystalline and have a closed morphology.

A further object of the present invention is to provide a method for the production of carbon encapsulated metal particles, or nanoparticles, wherein the carbon coating is highly crystalline and has a closed morphology.

A further object of the present invention is to provide nanotubes having no open graphite plane edges and the crystalline imperfection which would result therefrom.

A further object of the present invention is to provide carbon encapsulated metal particles, or nanoparticles, which contain no open edges which would compromise the integrity of the encapsulation.

A further object of the present invention is to provide metal particle magnetic recording media which are protected from oxidation by a carbon encapsulation of the metal particles.

A further object of the present invention is to provide conductive material for thermal composites, which use the nanotubes of the present invention as a heat bridge, e.g. between semiconductor components and heat sink substrates.

These and other objects of the present invention have been satisfied by the discovery that encapsulated nanoparticles, nanotubes and other closed carbon structures can be produced by the catalytic disproportionation of carbon monoxide in the substantial absence of hydrogen, using a catalyst of a transition metal or a compound or alloy thereof, at temperatures from 300° to 1000° C.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying figures, wherein.

DESCRIPTION OF THE PREFERRED EMBODIMENTS

The present invention relates to a method for the production of carbon nanotubes, carbon encapsulated nanoparticles and other closed carbon structures comprising contacting a dried, reduced and hydrogen free catalyst of a transition metal, or alloy or compound thereof, which may be a supported metal catalyst, with a gas mixture containing carbon monoxide, preferably a mixture of $CO/CO_2$, and an amount of available molecular hydrogen which is insufficient to cause formation of graphite plane edges through capping, preferably $\leq 0.1$ mol % $H_2$ at 400° C., at a temperature in the range from 300°–1000° C., preferably 300°–800° C. The reaction can be performed for substantially long periods of time typically for at least 1 h, preferably 1 h to 4 days, most preferably from 4–24 h, although it is possible to perform the reaction for many days in order to obtain longer nanotubes and more nanotubes.

Within the context of the present invention, the term "closed" or "closed carbon structure" is used to denote that there are no exposed (or open) graphite plane edges on the surface of the carbon formation. Further, the closed carbon structures produced by the present method have graphite basal planes which are parallel to one another and are coplanar, both to one another and to the surface of any metal particle which may be encapsulated therein.

The resulting product contains a mixture of encapsulated nanoparticles and nanotubes. Which of the two forms is the major product is dependant on the conditions of the reaction, particularly the reaction time and temperature, with nanoparticles being favored at shorter reaction times (10 hours or less) and nanotubes being favored at longer reaction times (15 hours or more). However, note that these reaction times are highly dependant on the rate of the CO disproportionation reaction itself. Accordingly, some variation is possible.

The catalyst of the present invention is a transition metal, preferably from Group VIII of the Periodic Table, or a compound or alloy thereof. Most preferably, the catalyst is made of Co, Fe, Ni or Ru metal, which may be a supported catalyst. Typical supports for such metal catalysts include Kieselguhr (a high surface area silica), silica-alumina, alumina and other conventional supports for metal catalysts. The catalyst may also be a compound of the transition metal, such as an oxide, sulfide, phosphide or carbide. While others in the field have postulated that the elemental metal is the catalytic species in such reactions, it has been found in the course of the present invention, that it is possible to start with compounds such as the oxide, and still obtain reaction, although the final product mixture may vary due to the change in catalyst. However, while such metal compounds or alloys can be used, the preferred catalyst is a supported metal selected from Co, Ni, Fe, and Ru, with the most preferred metal being Ni, with the metal being present in about a 1:1 ratio by weight, with respect to the support material.

A key requirement for the success of the present process is the use of a thoroughly dried catalyst. Prior to the disproportionation reaction, it is preferred to first dry the catalyst under inert gas, such as nitrogen or argon, at a temperature of from 300° to 800° C., preferably from 400° to 600° C., for a period of time of from 1 to 5 h, then reduce the catalyst with hydrogen. After the catalyst has been reduced with hydrogen it is imperative to perform a second drying step and rigorously purge hydrogen from the system. After purging the level of residual hydrogen is preferably less than $5 \times 10^{-4}$ mol of $H_2$ equivalent per gram of catalyst, for a 50% loaded, supported catalyst. Usually, the residual hydrogen is between $1 \times 10^{-4}$ and $5 \times 10^{-4}$ mol of $H_2$ equivalent. It is also advantageous to then take the dry, substantially hydrogen free catalyst, and deposit an initial deposit of carbon, by reaction of CO, then burn off the initial deposit of carbon, e.g. by raising the temperature enough that the carbon activity of the fixed composition flowing gas falls below one and the mixture then gasifies carbon, before depositing the nanoparticles and nanotubes of the present invention.

Previously, it has been thought by others in this field that it is impossible to initiate the CO disproportionation reaction without the presence of at least a small amount (about 0.2%) of available molecular hydrogen in the reaction mixture. However, by using the above catalyst preparation steps and an appropriate catalyst, the present method has shown that the disproportionation reaction can be initiated in the rigorous absence of hydrogen sources, and even more surprisingly, produces closed carbon structures such as nanotubes and encapsulated metal nanoparticles.

Figure 5:
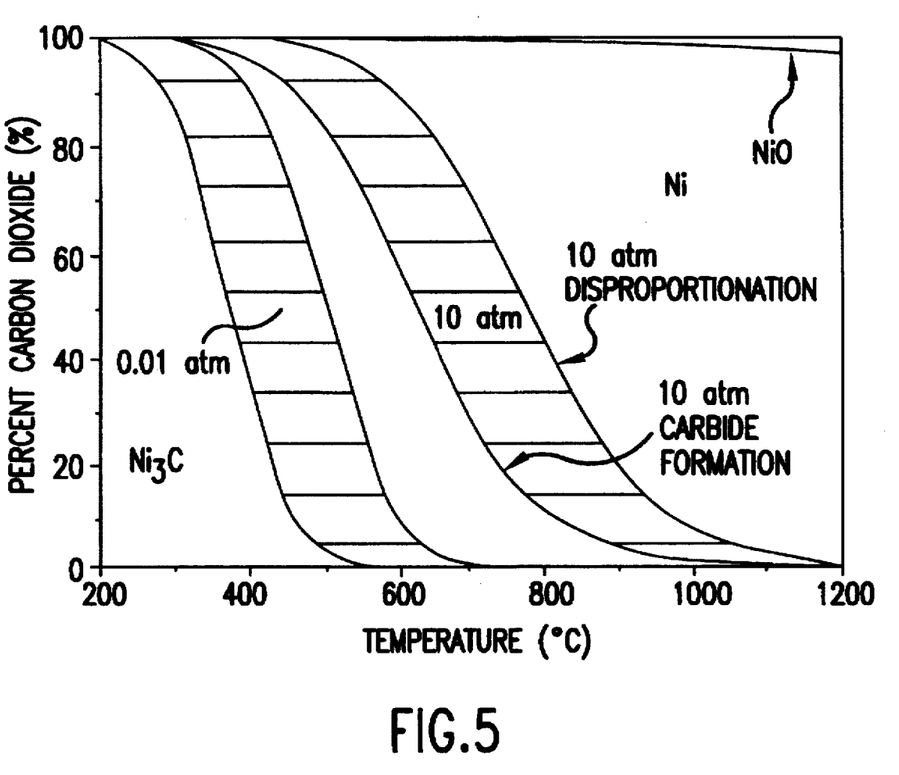
FIG. 5 shows a stability diagram for the use of Ni as catalyst in the CO disproportionation reaction of the present invention.

When the process of the present invention is performed, the temperature of reaction is maintained at a level from 300°–1000° C., preferably from 300°–800° C., most preferably from 400°–600° C. It is important to note that the maximum level of hydrogen which can be tolerated is highly temperature dependant, as well as depending somewhat on other conditions. Also, when the temperature of reaction is greater than 800° C., even when the reaction gas contains substantially Co, the equilibrium of the disproportionation reaction (1) shifts to begin making the reverse reaction of gasification of C by $CO_2$ to form CO the preferred pathway. Thus, temperatures less than 800° C. are preferred, along with mixtures of CO and $CO_2$ as the reaction gas. By using such a reaction mixture of CO and $CO_2$ the reaction can be carefully controlled to provide more uniform and longer nanotubes. The relationship between $CO/CO_2$ ratio and temperature and pressure is exemplified by the phase diagrams of FIG. 5. FIG. 5 shows the operating region for the present process (the hatched regions) at 0.01 atm and at 10 atm pressure over a wide temperature range for the Ni catalyst. The preferred operating pressure for the process of the present invention is from 1 to 2 atm, although pressures outside this range are also acceptable with proper adjustment of the temperature and $CO/CO_2$ ratio to maintain sufficient carbon activity. As partial pressures change, there is a nonlinear change in carbon activity. Thus, the reaction conditions are adjusted accordingly to provide an acceptable carbon activity and reaction rate.

In the process of the present invention, control of hydrogen availability (e.g. the mol % of molecular hydrogen available in the reaction gas or residual water and hydroxyl from inadequately dried catalyst) is critical. For example, for a 50% metal loading catalyst, the preferred residual water is from 0.1–0.5%. When hydrogen availability is varied, the deposit morphology changes. In addition, hydrogen partial pressure has been known to significantly impact the rate at which carbon forms (Olsson et al., Met. Trans. 5, 21 (1974)). One key in the discovery of the present invention is the recognition that hydrogen in any form can be a determining factor in carbon deposit morphology. This has not been fully appreciated by others in the present field, since it has been generally accepted and believed that hydrogen or a compound containing hydrogen is a necessary component in the gas mixture to form filaments (Nolan et al, Carbon, and Olsson et al). Accordingly, those previous workers in this field have formed filaments from hydrocarbon gases, or from CO with some hydrogen present, rather than forming nanotubes. In the past, the terms "filament", "tube", and "nanotube" have been used rather indiscriminately, e.g. by Tenant. However, within the context of the present invention, the term "filament" and the term "nanotube" have distinct and separate meanings as described herein. The primary difference between filaments and nanotubes is the presence of open plane edges in filaments, wherein nanotubes, as prepared in the present invention have no open plane edges and are thus true closed structures.

Although it is possible to term the nanotubes of the present invention as "fullerenes", the term "fullerene" is normally considered to refer to carbon molecules with a low number of carbon atoms (i.e., in the hundreds at most). The carbon nanotubes provided by the present process have many more carbon atoms, on the order of thousands (and usually on the order of hundreds of thousands), so it is preferred to not call them fullerenes. There is no obvious name for the novel category of carbon formations found using the present invention. They may be referred to generally as "clusters". The tubular forms are commonly called nanotubes. The spherical forms are commonly called nanoencapsulates if filled, e.g. by a catalyst particle.

The forms of carbon found using the process of the present invention, when no hydrogen is present, are all "closed"; there are no open-edged graphite planes. Conventional filaments have open edged graphite planes. These open-edged graphite planes in conventional filaments are thought to be made possible by the presence of hydrogen, either from hydrogen gas or from a compound containing hydrogen as an elemental component such as water or methane. Using the method of the present invention, with minimal hydrogen sources available, edges do not form, thus providing closed forms of carbon, such as shells and nanotubes.

In the present invention, CO disproportionation is used as the reaction for the formation of the carbon nanotubes, in accordance with equation (1):

$$2CO = C + CO_2 \tag{1}$$

In order to control the rate of the disproportionation reaction, a mixture of CO and $CO_2$ is used with $CO/CO_2$ ratios being selected to provide a carbon activity as appropriate for the desired product, e.g. from 10 to 50 at about 500° C. Carbon activity, $a_c$, is defined in accordance with the following equation:

$$K_{eq} = P_{CO}^2 / (P_{CO_2})(a_c)$$

wherein $K_{eq}$ is the equilibrium constant for the reaction of equation (1), which is highly temperature dependant, and $P_{CO}$ and $P_{CO2}$ are the partial pressures of carbon monoxide and carbon dioxide respectively. When rearranged as follows:

$$a_C = P_{CO}^2/(P_{CO2})(K_{eq}),$$

thus showing that at a given total pressure and partial pressures of CO and $CO_2$, carbon activity, $a_C$, varies with temperature. Carbon deposits from a gas at those temperatures where the activity is one or greater and is gasified by a gas at those temperatures where activity is less than one.

Typical $CO/CO_2$ ratios to provide such carbon activities range from 1:9 to 1:2. Generally a higher ratio of CO to $CO_2$ is required as temperature increases.

Of particular interest is whether the hydrogenation of CO:

$$CO + H_2 = C + H_2O \quad (2)$$

would occur to a degree that it would affect the above calculations. It has been shown that the rate of CO disproportionation is substantially greater than the rate of reaction (2) at low concentrations of $H_2$ (Olsson et al). Thus, the rate of reaction (2) does not appear to be sufficient to scavenge hydrogen and prevent its migration to graphite edges. Plus, under the conditions of the present process, the reverse reaction of equation (2) above, namely $C + H_2O = CO + H_2$ occurs and can regenerate hydrogen even if it is all converted into water. Thus the presence of hydrogen in any form in the present process will end up capping graphite plane edges.

In the present process, however, no hydrogen or other bond satisfying species are present. Thus, only closed forms of carbon, i.e. shells and nanotubes, are prepared using the present process.

One advantage of producing nanotubes by the present catalytic process instead of the conventional arc-discharge technique is that the reaction temperature is lower and more even, allowing better control of production conditions for uniform output. In addition, more economical starting materials and less energy are used in the process compared to conventional arc-discharge. Nanotubes are industrially useful as the reinforcing component in high strength composites. Nanotubes, such as those prepared by the present invention, have a strength and modulus of elasticity advantage over a filament, since shearing a nanotube along its axis requires breaking strong covalent bonds, while shearing a filament along its axis requires breaking the weaker bonds between graphite layers. This is because the strong covalent bonds of nanotubes are in the direction of the length of the tube, as opposed to the weakly bonded graphitic layers of a standard carbon filament. Also, the nanotubes of the present invention are significantly smaller (i.e., 0.02 µm O.D.) than typical carbon fibers or filaments (commonly 10 µm O.D.).

An additional advantage of the closed carbon structures of the present invention is that the carbon has a markedly reduced susceptibility to environmental attack, such as oxidation.

The present method also provides better control over the diameter and length of tubes produced compared to the arc-discharge method of preparing nanotubes. The ability to produce nanotubes with encapsulated metal particles in this new fashion could be industrially important, since such metal encapsulates would alter the properties of the nanotubes by increasing electrical and thermal conductivity.

Nanotubes as prepared by the present invention are useful in thermal composites. Such composites are used to adhere semiconductor components, such as laser diodes, onto their heat sink substrates. The nanotubes of the present invention would provide a thermal bridge through the adhesive layer used to adhere the semiconductor components. While the thermal conductivity along the planes in HOPG (highly oriented pyrolytic graphite, similar to the structure of nanotubes but not of filaments) is about 1960 W/m·K (compared to 401 W/m·K for copper and 436 W/m·K for silver), it is only 5.73 W/m·K through the planes. Thus it is highly important to have graphite planes which are truly parallel to the tube axis with substantially no edges on the surface of the tube. Thermal composite applications add conductive material to an adhesive, such as an epoxy, which has a thermal conductivity of only 0.2 W/m·K. Such thermal composite adhesives are used, e.g. to bond chips to heat spreaders and then to bond such heat spreaders to substrates. Conventionally, diamonds have been used to provide the heat spreader or thermal bridge between the semiconductor component and the heat sink substrate, typically a large piece of copper or aluminum. Special metal loaded epoxies are conventionally used in such applications, which have 20–30% ground metal in the epoxy, which provides a 1 order of magnitude increase in the thermal conductivity to about 2 W/m·K. However, upon loading the epoxy with 10% of the present nanotubes, e.g. by flocking the nanotubes to the epoxy, the thermal conductivity of the epoxy could be increased by up to three orders of magnitude compared to epoxy alone. Since thermal resistances add inversely (1/r = 1/r1 + 1/r2 + . . . ), even a thin low conductivity adhesive layer presents a major thermal barrier. Thus a three orders of magnitude improvement in thermal conductivity would be a significant commercial improvement.

A further significant application for the encapsulated nanoparticles of the present invention is in the area of metal particle magnetic recording media. The metal particles conventionally used in magnetic particle media include a variety of fine metal oxides. These particles have to be protected from oxidation, especially due to their very fine particle size. At such fine particle size, unprotected metal particles undergo a rapid, combustionlike, oxidation. With the carbon protected particles prepared by the present method, the particles would be adequately protected from oxidation, while maintaining their magnetic properties. Such nanoparticles can be used in conventional metal particle recording media formulations with relative ease.

The fundamental process of arc-discharge carbon nanotube production systems is vaporization of carbon atoms, followed by condensation to solid carbon forms. The present process uses catalytic reaction (disproportionation) of CO to produce carbon atoms. The catalyst metal then serves to 'redirect' carbon into the clusters of interest. The present process uses much lower temperatures and more uniform conditions than conventional methods of producing nanotubes. These mild and uniform conditions offer the ability of growing longer nanotubes than can be produced with the arc-discharge method.

The present discovery of how hydrogen influences carbon nanotube formation is one advantage provided by the present invention compared to the previous work in the field. Unless one understands the impact of hydrogen, they are doomed to create weak and low thermal and electrical conductivity filaments instead of the strong, high conductivity nanotubes of the present invention.

Having generally described this invention, a further understanding can be obtained by reference to certain specific examples which are provided herein for purposes of illustration only and are not intended to be limiting unless otherwise specified.

EXAMPLES

Carbon deposit samples were prepared by exposing a catalyst to flowing reaction gas at 500° C. and ambient pressure (0.93 atm). The catalyst used was 60 wt % nickel on silica-alumina support (Johnson Matthey, Ward Hill, MA). The reaction gas consisted of mixtures of $CO_2$ (99.99% minimum purity), CO (99.9% minimum purity), and in most experiments $H_2$ (99.5% minimum purity) or a tank with 3% $H_2$/balance $N_2$. Gases were used without further purification. Mixtures were prepared with approximately 20% CO in $CO_2$ to maintain non-carbiding conditions. The actual gas mixture for each experiment was determined by gas chromatography.

A Hitachi (Gaithersburg, MD) H-8100 Transmission Electron Microscope (TEM) operating at 200kV was used to identify and characterize carbon deposited on the catalyst particles. TEM specimens were prepared by sonicating reacted catalyst powder in alcohol, then dipping a TEM sample grid into the dispersion.

Figure 6:
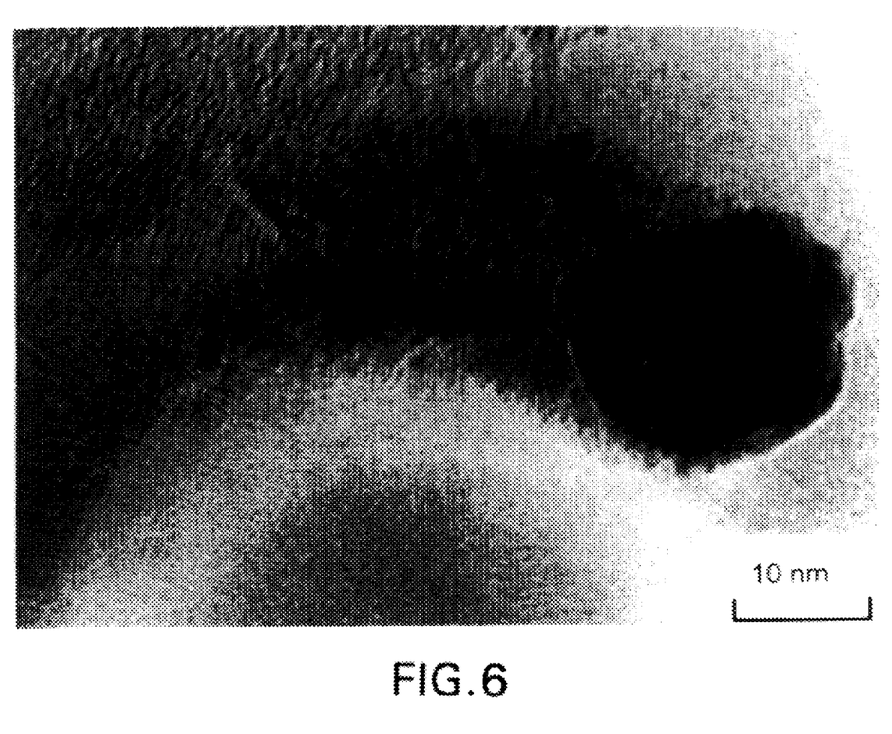
FIG. 6 shows a TEM photograph of a carbon filament formed in the presence of hydrogen.

Crystalline graphite was identified in the TEM micrograph by the nominally 0.335 nm spacing between layers of the basal planes. In each of the specimens examined, graphite was found by observation of fringes caused when the electron beam was transmitted through planes of graphite parallel to the beam. Micrographs of specimens exposed to the different gas mixtures showed a distinct difference in morphologies when carbon was formed in the presence or absence of $H_2$. Only filaments were formed when $H_2$ was present. FIG. 6 is a micrograph of a filament formed under a gas mixture containing 1% $H_2$. It can be compared to the schematic of FIG. 1.

Figure 7:
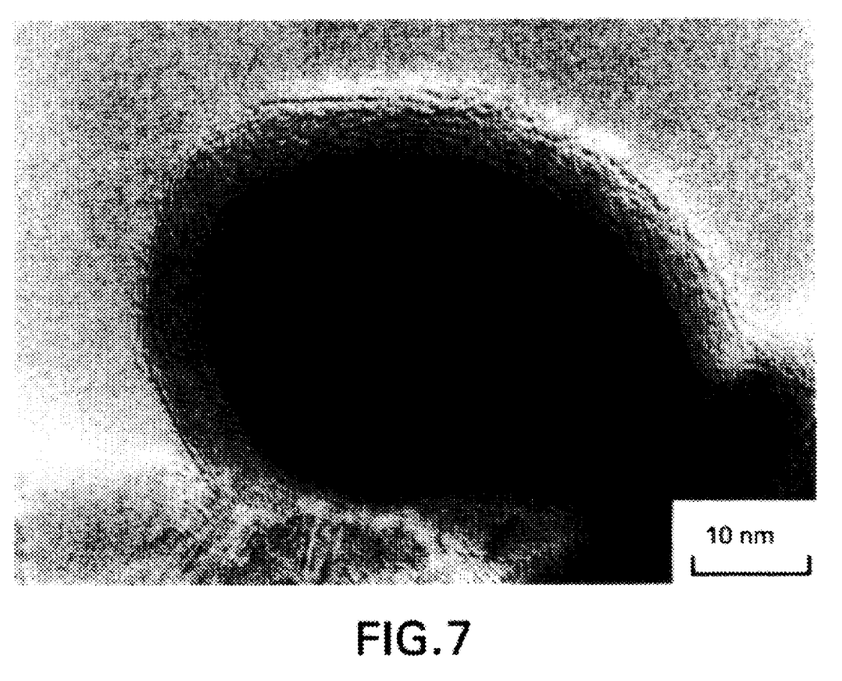
FIG. 7 shows a carbon encapsulated nanoparticle, or shell carbon, formed in accordance with the present invention.
Figure 8:
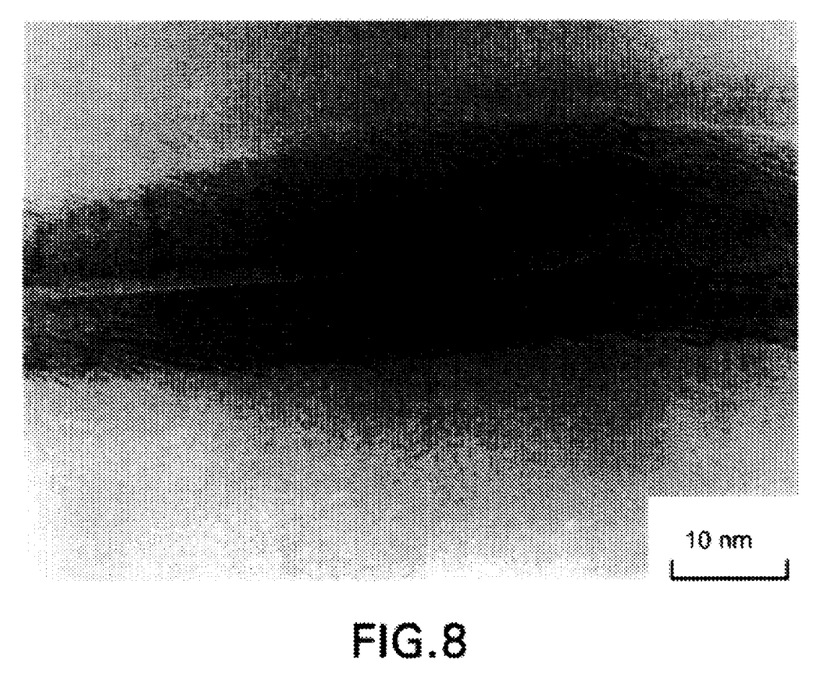
FIG. 8 shows a nanotube formed in accordance with the present invention.

When there was no $H_2$ during deposition, two different types of carbon were formed. Both encapsulating shells and nanotubes were seen, as shown in FIGS. 7 and 8.

Figure 9:
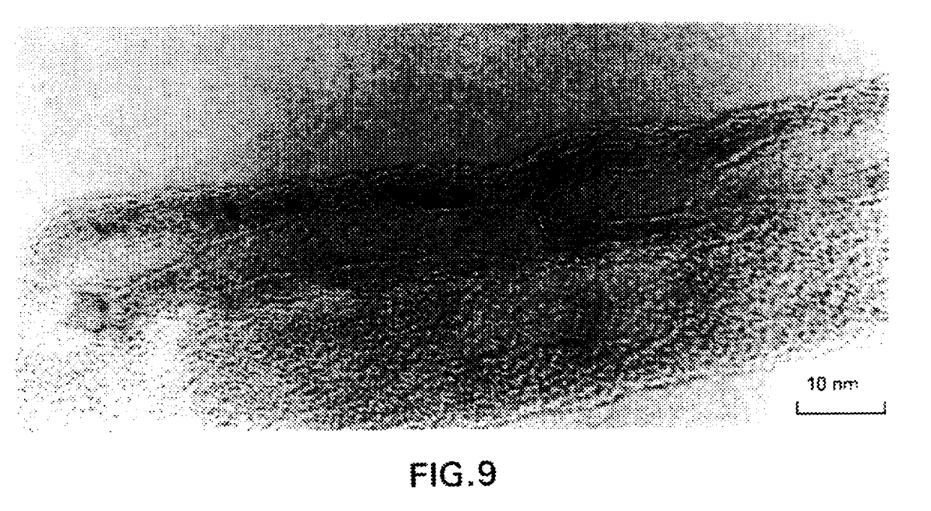
FIG. 9 shows a filament formed in the presence of 0.3% hydrogen as a comparison to the nanotubes of the present invention.

When low levels of $H_2$ existed in the gas mixture, a mix of morphologies were present. As the amount of $H_2$ was decreased to 0.3% $H_2$ and then to 0.03% $H_2$, fewer filaments were observed. It appears that between these two levels of hydrogen, a transition occurred from predominately filament formation to predominately shell and nanotube formation. In the specimen produced with 0.3% $H_2$ the orientation of the graphite planes in filaments was closer to the direction of the filament axis, compared to a typical filament, as can be seen in FIG. 9.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for the production of carbon encapsulated metal particles and carbon nanotubes comprising:
   1) drying a catalyst of a transition metal, or a compound or alloy thereof, in an inert gas at a temperature and for a period of time sufficient to form a dried catalyst;
   2) reducing said dried catalyst with hydrogen to form a reduced catalyst;
   3) contacting said reduced catalyst with an inert gas under conditions effective to reduce the level of residual hydrogen therein to less than about $5 \times 10^{-4}$ mol of $H_2$ equivalent per gram of catalyst, and then
   4) contacting the catalyst from step (3) with a gas mixture containing carbon monoxide, and an amount of available molecular hydrogen which is insufficient to cause formation of graphite plane edges through capping, at a temperature in the range of from 300°–1000° C., to thereby form carbon nanotubes and metal particles of said catalyst which are carbon encapsulated.

2. The method of claim 1, wherein said catalyst is a member selected from the group consisting of the Group VIII metals of the Periodic Table and compounds and alloys thereof.

3. The method of claim 1, wherein said catalyst is a member selected from the group consisting of Ni, Co, Fe, Ru and compounds and alloys thereof.

4. The method of claim 1, wherein said catalyst is a supported catalyst.

5. The method of claim 4, wherein said catalyst is a member selected from the group consisting of Ni, Co, Fe and Ru metals.

6. The method of claim 1, wherein said catalyst is Ni metal supported on a support of Kieselguhr or silica-alumina.

7. The method of claim 1, wherein said catalyst is cobalt supported on alumina or silica.

8. The method of claim 1, wherein said gas mixture comprises carbon monoxide, carbon dioxide and $\leq 0.1$ mol % of available hydrogen as hydrogen gas or hydrocarbon gas.

9. The method of claim 8, wherein carbon monoxide and carbon dioxide are present in a $CO/CO_2$ ratio sufficient to provide a carbon activity, $a_c$, of from 10 to 50.

10. The method of claim 1, wherein said gas mixture contains no hydrogen as hydrogen gas or hydrocarbon gas.

11. The method of claim 1, wherein said temperature in step 4 is from 300°–800° C.

12. The method of claim 1, wherein said temperature in step 4 is from 500–700° C.

13. The method of claim 1, wherein said drying of said catalyst is carried out in an inert gas at a temperature of from 300° to 800° C, for a period of time from 1 to 5 h.

14. The method of claim 1, wherein said method provides carbon encapsulated metal nanoparticles as a major product.

15. The method of claim 1, wherein said method provides carbon nanotubes as a major product.

16. The method of claim 1, wherein said method is performed for a period of time of from 1 h to 4 days.

* * * * *